(12) United States Patent
Otsuki

(10) Patent No.: US 6,417,568 B1
(45) Date of Patent: Jul. 9, 2002

(54) SEMICONDUCTOR DEVICE

(75) Inventor: Kazutaka Otsuki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/522,908

(22) Filed: Mar. 10, 2000

(30) Foreign Application Priority Data

Mar. 12, 1999 (JP) .......................................... 11-067609

(51) Int. Cl.$^7$ .............................................. H01L 23/48
(52) U.S. Cl. ........................ 257/755; 257/763; 257/784
(58) Field of Search ................................ 257/755, 784, 257/781, 763

(56) References Cited

U.S. PATENT DOCUMENTS

| | | | | |
|---|---|---|---|---|
| 4,916,397 A | * | 4/1990 | Masuda et al. | 257/754 |
| 4,984,056 A | * | 1/1991 | Fujimoto et al. | 257/753 |
| 5,036,383 A | * | 7/1991 | Mori | 257/751 |
| 5,661,081 A | * | 8/1997 | Hsue et al. | 438/106 |
| 5,707,894 A | * | 1/1998 | Hsiao | 438/614 |

FOREIGN PATENT DOCUMENTS

| | | | |
|---|---|---|---|
| JP | 64-37031 | 2/1989 | |
| JP | 3-16145 | 1/1991 | |
| JP | 6-29294 | 2/1994 | |
| JP | 7-130789 | 5/1995 | |
| JP | 2550248 | 8/1996 | |
| JP | 8-203952 | 8/1996 | |
| JP | 8-293521 | 11/1996 | |
| JP | 8-293522 | 11/1996 | |
| JP | 9-8134 | 1/1997 | |
| JP | 9-270426 | * 10/1997 | ....... H01L/21/3205 |
| JP | 11-8264 | 1/1999 | |

* cited by examiner

Primary Examiner—T. N. Quach
(74) Attorney, Agent, or Firm—Sughrue Mion, PLLC

(57) ABSTRACT

A polycide film is selectively formed in a bonding area of a silicon substrate. A BPSG film is formed as an interlayer insulating film comprising boron. Many contact holes are made, on the polycide film, in the BPSG film. Tungsten plugs are embedded in the contact holes. A film of titanium and a titanium compound is formed between the tungsten plugs and the aluminum film, and the BPSG film and the polycide film.

4 Claims, 2 Drawing Sheets

SEMICONDUCTOR DEVICE

BACKGROUND OF THE INVENTION

1. Field of the Invention

The present invention relates to a semiconductor devise having an improved structure of a bonding pad, and in particular to a semiconductor device comprising, as an interlayer insulating film, a BPSG film (an oxide film containing boron and phosphorus), and comprising a Ti film and a TiN film beneath a bonding pad film.

2. Description of the Related Art

FIG. 1 is a sectional view of a conventional bonding pad. A field oxide film 22 is deposited on a silicon substrate 21 to have a thickness of about 3000 Å. The field oxide film 22 is covered with a BPSG film 24, as an interlayer insulating film, of about 4000 Å in thickness. A TiN/Ti film 27 (a lamination layer of a TiN film as an upper layer and a Ti film as a lower layer) of about 2000 Å in thickness is deposited on a bonding pad forming area of the BPSG film 24. An aluminum film 28 of about 8000 Å in thickness is deposited as a bonding pad on the TiN/Ti film 27. An opening is made in a cover film 29 formed on the whole surface in the manner that a part of each of the bonding areas of the aluminum film 28 is exposed.

In this manner, in the sectional structure of the conventional bonding pad, the BPSG film 24 directly contacts the Ti film of the TiN/Ti film 27. For this reason, the conventional bonding pad has a drawback that the aluminum film 28 is easily peeled off when the pad is subjected to ball bonding to the Al film 28.

The peeling off of the aluminum film 28 of the bonding pad by the ball bonding becomes still more remarkable as the buffering effect of the aluminum film 28 itself against the stress at the time of the bonding becomes smaller by making the aluminum film 28 thinner. In order to make the width of aluminum wiring finer, it is necessary to make the aluminum film thinner. However, easy peeling-off of the aluminum film 28 upon the ball bonding is a factor of hindering the width of the aluminum wiring from being made finer. In other words, in order to realize a finer wiring width by working the aluminum film by plasma etching, it is necessary to make a resist film, which is, an etching mask material, thinner. This is for the purpose of improving the resolution of the resist film. In this case, the etching rate of the resist film that is the etching mask material to the aluminum film to be etched is small. At the time of plasmaetching the aluminum film, therefore, in order not to etch all of the resist film that has been made thinner, it is necessary that by making the aluminum film thinner, the time required for etching the aluminum film is shortened. If the aluminum film attempts to be made thinner, the film is easily peeled off in this way upon bonding. After all, it is difficult to make the width of the aluminum wiring thinner.

Thus, in order to prevent the aluminum film of such a bonding pad from being peeled off, the Patent Gazette No. 2550248 suggests a sectional structure of a bonding pad shown in FIG. 2. That is, a field oxide film 32 is deposited on a silicon substrate 31. A polycide film 33 that is a lamination layer made of a tungsten silicide film 33b as an upper layer and a polycrystal silicon film 33a as a lower layer is formed in bonding pad forming area on the field oxide film 32. A BPSG film 34 that is an interlayer insulating film is made to cover the field oxide film 32 and the polycide film 33. A large number of contact holes 35 are made in the BPSG film 34 to reach the polycide film 33. Tungsten is embedded as plugs in the contact holes 35 to form tungsten plugs 36.

A TiN/Ti film 37 (a lamination film of a TiN film as an upper layer and a Ti film as a lower layer) is formed on the tungsten plugs 36 embedded in the contact holes 35 and the BPSG film 34 that is present in the bonding pad forming areas. An aluminum film 38 is formed as bonding pads on the TiN/Ti film 37. Each of openings is made in a cover film 39 formed on the whole surface in the manner that a part of each of the bonding areas of the aluminum film 38 is exposed.

As described above, in the semiconductor device described in the above-mentioned Gazette, the tungsten plugs 36 are directly embedded in the contact holes 35 and subsequently the Tin/Ti film 37 is formed. Therefore, the Ti film as the lower layer of the TiN/Ti film 37 is brought into contact with not only the BPSG film 34 but also the tungsten plugs 36. For this reason, the contact area of the Ti film as the lower layer of the TiN/Ti film 37 and the BPSG film 34 is reduced to a value lower than the value by conventional semiconductor devices. Thus, the aluminum film 38 is not easily peeled off.

However, in the conventional semiconductor device described in the above-mentioned Gazette, tungsten that is a plug material for contacts is directly embedded in the contact holes 35. In element areas inside the semiconductor device, therefore, an impurity diffusion layer, which is formed in the silicon substrate, and tungsten are directly brought into contact with each other in the connection portion of the impurity diffusion layer and the aluminum wiring. Ti has the smallest resistance of contact with silicon among all metals. Accordingly, the contact resistance is larger in the case that the impurity diffusion layer is brought into contact with tungsten than in the case that the impurity diffusion layer is brought into contact with the Ti film. As a result, in the former case the properties and performances of the semiconductor device deteriorate.

Tungsten has the property that it does not adhere easily onto any insulating film. Therefore, if the tungsten plugs 36 are directly embedded in the contact holes 35, the embedded tungsten may be peeled off from the BPSG film on side walls of the contact holes 35. Such relationship between the BPSG film on the side walls of the contact holes and the tungsten is also true for contact holes made in the element area inside the semiconductor device. There is therefore a problem that is not favorite for reliability of the device.

SUMMARY OF THE INVENTION

The object of the present invention is to provide a semiconductor (device making it possible to surely prevent an aluminum film which constitutes a bonding pad from being peeled off.

The semiconductor device according to the present invention comprises a semiconductor substrate, a polycide film selectively formed in a bonding area on the semiconductor substrate, an interlayer insulating film that is formed on the semiconductor substrate and comprises boron, a bonding pad film arranged on the polycide film, and a film of titanium ants a titanium compound that is formed between the polycide film and the bonding pad film to contact the polycide film and the bonding pad film.

This semiconductor device may have a structure wherein a plurality of contact holes are made in the interlayer insulating film on the polycide film, the holes penetrating the interlayer insulating film, and further the film of the titanium and the titanium compound is formed between the bonding pad film and the interlayer insulating film, and on bottom faces and side faces of the contact holes.

This semiconductor device may have a structure wherein an opening is made, on the polycide film, in the interlayer insulating film and the polycide film contacts the film of the titanium and the titanium compound continuously inside the bonding area.

The above-mentioned bonding pad film comprises, for example, an aluminum film. The above-mentioned polycide film is, for example, a lamination film that comprises an upper film comprising a substance selected from the group consisting of high melting-point metals, silicide thereof and nitride thereof, and a lower film comprising a polysilicon film. A field oxide film is formed between the silicon substrate and the polycide film.

As described above, according to the present invention, the TiN/Ti film is arranged between the aluminum film which makes the bonding pad and the polycide film beneath it so as to contact both of the aluminum film and the polycide film. Thus, it is possible to reinforce low capability of adhesion between the interlayer insulating film such as a BPSG film and the Ti film and improve resistance against the peeling-off of the bonding pad (an aluminum film) at the time of ball bonding.

In the contact between an impurity diffusion layer that is simultaneously formed inside an element area inside the semiconductor device and aluminum wiring, the contact resistance between the impurity diffusion layer and the aluminum wiring can be made lower than in the case that tungsten plugs are made without formation of any TiN/Ti film.

The present invention makes it possible to still more improve resistance against peeling-off of the aluminum bonding pad without any affect by low capability of adhesion between the tungsten and the interlayer insulating film (such as a BPSG film). Therefore, peeling-resistance of the aluminum bonding pad is also improved in contact holes formed in the element area inside the semiconductor device. Thus, the reliability of the semiconductor device is improved.

DETAILED DESCRIPTION OF THE PREFERRED EMBODIMENTS

Referring to the attached drawings, embodiments of the present invention will be specifically described hereinafter.

Figure 1:
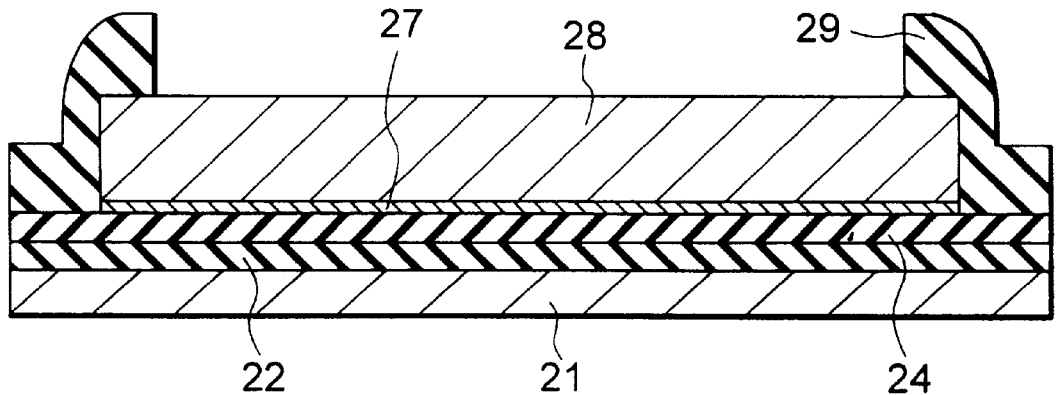
FIG. 1 is a sectional view showing a bonding pad area of a conventional semiconductor device.
Figure 2:
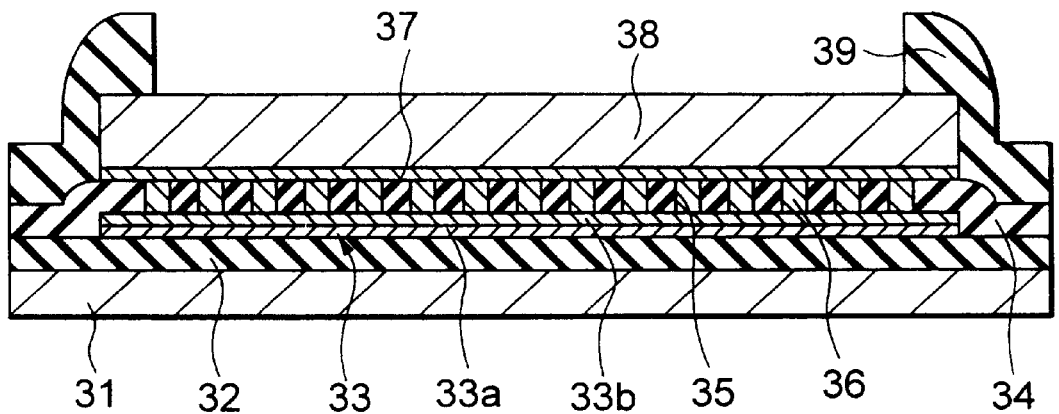
FIG. 2 is a sectional view showing another conventional semiconductor device.
Figure 3:
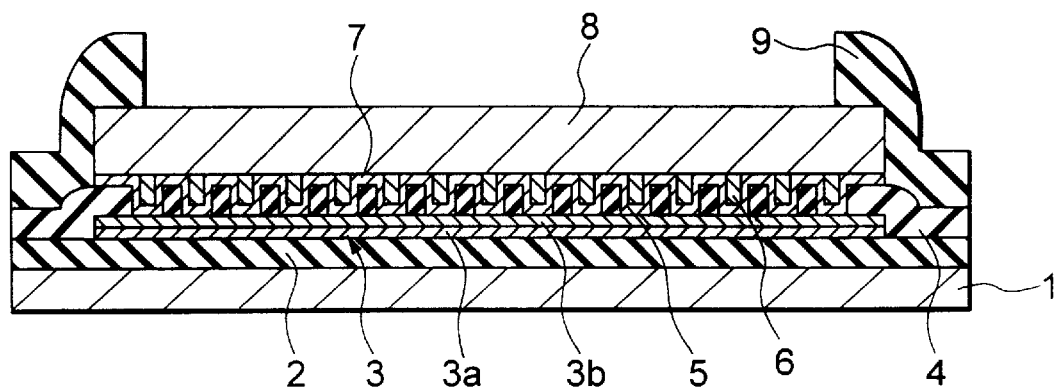
FIG. 3 is a sectional view showing a semiconductor device according to a first embodiment of the present invention.

FIG. 3 is a sectional view of a semiconductor device according to a first embodiment of the present invention.

A field oxide film 2 is deposited on a silicon substrate 1 to have a thickness of about 3000 Å. A polycide film 3 that is a lamination layer made of a tungsten silicide film 3b as an upper layer and a polycrystal silicon film 3a as a lower layer is formed in a bonding pad forming area on the field oxide film 2, so as to have a thickness of about 3000 Å.

A BPSG film 4 that is an interlayer insulating film and has a thickness of about 4000 Å is made to cover the field oxide film 2 and the polycide film 3. A large number of contact holes 5 having a diameter of 0.4 $\mu$m are made in the BPSG film 4 to reach the polycide film 3. The upper surface of the BPSG film 4 of the bonding pad forming area and the bottom and side walls of the contact holes 5 are covered with a TiN/Ti film 7 (a lamination film of a TiN film as an upper layer and a Ti film as a lower layer) of about 2000 Å in thickness. Tungsten is embedded as plugs in the contact holes 5 to form tungsten plugs 6.

An aluminum film 8 of about 6000 Å in thickness is formed in each bonding pad. This aluminum film 8 contacts the TIN/Ti film 7 and the tungsten plugs 6 formed beneath the film 8. An opening is made in a cover film 9 formed on the whole surface in the manner that a part of each of bonding areas of the aluminum film a is exposed. The above-mentioned structure and element areas inside the semiconductor device are simultaneously formed.

In the semiconductor device having the above-mentioned structure, according to the present embodiment, the TiN/Ti film 7 is formed on the side walls and the bottom walls of the contact holes 5 made in the BPSG film 4. The TiN/Ti film 7 formed between the aluminum film 8 and the BPSG film 4 contacts the polycide film 3 at the bottom of the contact holes 5. The strength of the junction between the Ti film as the lower layer of the TiN/Ti film 7 and the polycide film 3 is high, so as to prevent the aluminum film pad for bonding from being peel off.

In the element area inside the semiconductor device, an impurity diffusion layer, which is formed in the silicon substrate, are the Ti film as the lower layer of the TiN/Ti film 7 are directly brought into contact with each other in the connection portion of the impurity diffusion layer and the aluminum wiring. Ti has the smallest resistance of contact with the silicon substrate among all metals. As a result, in the present embodiment the properties and performances of the semiconductor device become higher than the case in which silicon is brought into contact with tungsten.

In the present invention, the tungsten plugs 6 are not directly brought into contact with the BPSG film 4, so that the BPSG film 4 is not peeled off from the tungsten plugs 6 embedded in the contact holes 35. Accordingly, in the contact holes made in the element area inside the semiconductor device, their resistance against peeling-off is improved. Thus, reliability of the semiconductor device is also improved.

Figure 4:
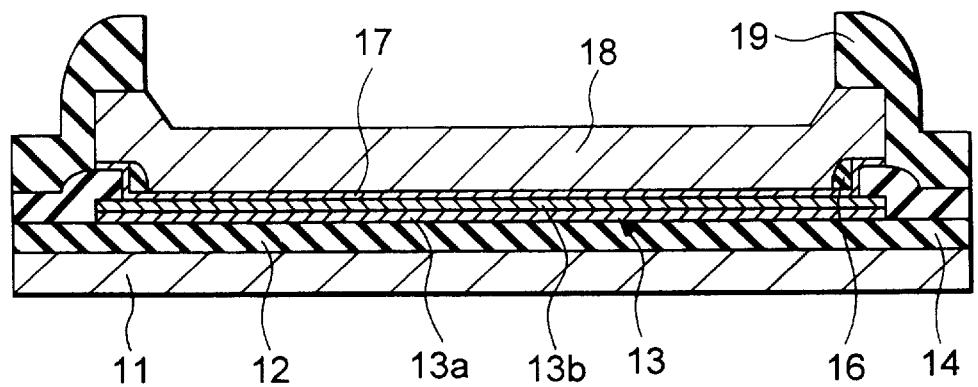
FIG. 4 is a sectional view showing a semiconductor device according to a second embodiment of the present invention.

The following will describe a second embodiment of the present invention, referring to FIG. 4. A field oxide film 12 is deposited on a silicon substrate 11 to have a thickness of about 3000 Å. A polycide film 13 that is a lamination layer made of a tungsten silicide film 13b as an upper layer and a polycrystal silicon film 13a as a lower layer is formed in a bonding pad forming area on the field oxide film 12, so as to have a thickness of about 3000 Å. A BSPG film 14 that has a thickness of about 4000 Å and is an interlayer insulating film covers about 0.5 $\mu$m-width of edges of the field oxide film 12 and the polycide film 13. In other words, the BPSG film 14 is removed on a large portion of the polycide film 13, which is a portion except about 0.5 $\mu$m-width of the edges of the polycide film 13, so that the contact holes having openings of a large diameter are formed on that portion. This is formed at the same time when contact holes are made in the element area inside the semiconductor device.

A TiN/Ti film 17 (a lamination film of a TiN film as an upper layer, and a Ti film as a lower layer) of about 2000 Å in thickness, which is a barrier metal, is deposited on the bonding pad forming area of the BPSG film 14 and on the polycide film 13 that is not covered with the BPSG film 14. A tungsten film 16 is formed as side walls, through the TiN/Ti film 17, on side walls of ends of the BPSG film 14 formed on the about 0.5 µm-width of edges of the polycide film 13. This is formed at the same time when tungsten plugs are embedded in the contact holes in the element area inside the semiconductor device. An aluminum film 18 of about 6000 Å an thickness is formed as bonding pads, and contacts the TiN/Ti film 17 and the tungsten film 16 that are formed beneath the film. An opening is made in a cover film 19 in the manner that a part of each of bonding areas of the aluminum film 18 is exposed. The above-mentioned structure is formed at the same time when the element areas the semiconductor device is formed.

In the semiconductor device having the above-mentioned structure, the polycide film 13 is formed between the aluminum film 18 and the field oxide film 12, so as to prevent the aluminum film 18 upon ball bonding from being peeled off in the same manner as in the first embodiment. Thus, the same effect as obtained in the first embodiment can be obtained. The area of contact of the BPSG film with the TiN/Ti film is smaller in the present embodiment than in the first embodiment. Thus, in the present embodiment, the aluminum film can be still more prevented from being peeled off.

What is claimed is:

1. A semiconductor device comprising:
   a semiconductor substrate,
   a polycide film selectively formed in a bonding area on the semiconductor substrate,
   an interlayer insulating film that is formed on the semiconductor substrate and includes boron,
   a bonding pad film arranged on the polycide film, and
   a film of titanium and a titanium compound that is formed between the polycide film and the bonding pad film to contact with the polycide film and the bonding pad film,
   wherein a plurality of contact holes are made in the interlayer insulating film on the polycide film, the holes penetrating the interlayer insulating film, and further the film of the titanium and the titanium compound is formed between the bonding pad film and the interlayer insulating film, and on bottom faces and side faces of the contact holes.

2. The semiconductor device according to claim 1, wherein the bonding pad film comprises an aluminum film.

3. The semiconductor device according to claim 1, wherein the polycide film is a lamination film that comprises an upper film comprising a silicide of a high melting-point metal, and a lower film comprising a polysilicon film.

4. The semiconductor device according to claim 1, wherein a field oxide film is formed between the silicon substrate and the polycide film.

* * * * *